United States Patent [19]

Bukhman et al.

[11] Patent Number: 4,853,347
[45] Date of Patent: Aug. 1, 1989

[54] SELECTIVE METAL DEPOSITION PROCESS

[75] Inventors: Yefim Bukhman, Phoenix; Gary F. Witting, Mesa, both of Ariz.

[73] Assignee: Motorola, Inc., Schaumburg, Ill.

[21] Appl. No.: 251,739

[22] Filed: Oct. 3, 1988

[51] Int. Cl.$^4$ .................... H01L 21/00; H01L 21/02; H01L 21/285; H01L 21/88
[52] U.S. Cl. ............................ 437/192; 437/187; 437/189; 437/200; 148/DIG. 147
[58] Field of Search .............................. 437/187, 200; 148/DIG. 147

[56] References Cited

U.S. PATENT DOCUMENTS 4,517,225  5/1985  Broadbent .......................... 437/245
4,766,006  8/1988  Gaczi ................................. 437/200

OTHER PUBLICATIONS

Wolf, S.; Silicon Processing for the VLSI Era, Chaps 6, 12 & 16, Lattice Press, 1986.

Primary Examiner—Brian E. Hearn
Assistant Examiner—B. Everhart
Attorney, Agent, or Firm—Harry A. Wolin

[57] ABSTRACT

A method for the selective deposition of metals in semiconductor device manufacturing wherein a wafer surface is subjected to a hydrogen species that reduces oxidation on conducting materials while also removing impurities from non-conducting materials. Metals are then selectively deposited upon the conducting materials and not upon the non-conducting materials. It should be understood that the hydrogen treatment step and the selective metal deposition step may be performed simultaneously or by using two separate processing steps.

9 Claims, 1 Drawing Sheet

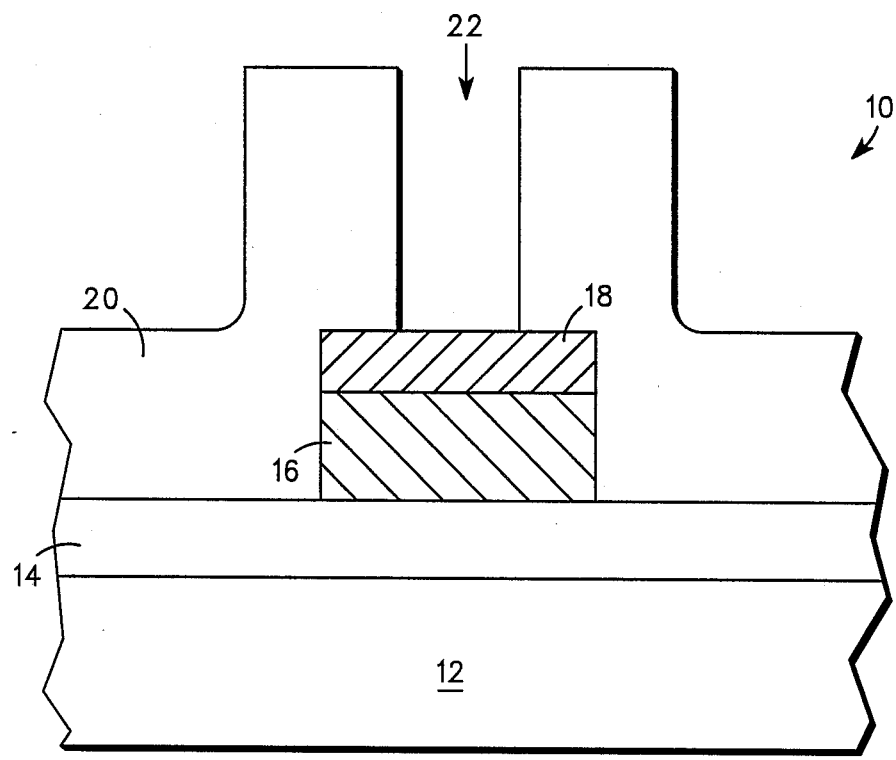

SELECTIVE METAL DEPOSITION PROCESS

BACKGROUND OF THE INVENTION

This invention relates, in general, to a method for the selective deposition of metals in semiconductor device manufacturing, and more particularly to a method for the selective deposition of metals in semiconductor device manufacturing wherein the wafer surface is exposed to a hydrogen species prior to metal deposition.

It is well known in the semiconductor art to selectively deposit metals in such applications as via fill in multilayer metal interconnect systems, contact fill to single or polycrystalline silicon, fabrication of Schottky barrier diodes and the like. Difficulties are commonly encountered in selectively depositing metal on conducting materials while not depositing it on nonconducting materials. For instance, native oxide growth on the conducting materials will inhibit metal deposition while contamination of the non-conducting materials will undesirably increase the probability that metal will be deposited thereon. Therefore, a method that will enhance or restore metal deposition selectivity in the manufacturing of semiconductor devices is highly desirable.

SUMMARY OF THE INVENTION

Accordingly, it is an object of the present invention to provide a method for the selective deposition of metals in semiconductor device manufacturing wherein the selectivity of deposition on conducting materials is enhanced.

Another object of the present invention is to provide a method for the selective deposition of metals in semiconductor device manufacturing wherein the deposition of metal on non-conducting surfaces is greatly decreased or eliminated.

It is an additional object of the present invention to provide a method for the selective deposition of metals in semiconductor device manufacturing that will eliminate or reduce the effect of native oxides on conducting materials while also removing impurities from nonconducting materials.

Yet a further object of the present invention is to provide a method for the selective deposition of metals in semiconductor device manufacturing wherein a metal containing gas is reduced by hydrogen.

An additional object of the present invention is to provide a method for the selective deposition of metals in semiconductor device manufacturing that does not destroy the semiconductor structure, alter diffusion distribution or damage the junction distribution.

The foregoing and other objects and advantages are achieved in the present invention by one embodiment in which, as a part thereof, includes exposing a wafer having semiconductor structures disposed on a first surface thereof, to a hydrogen species. The hydrogen species reduces native oxides that have grown on the conducting materials while also removing contaminating impurities from non-conducting materials. Either following the hydrogen species exposure or simultaneously therewith, metal is selectively deposited on the conducting materials of the semiconductor structure.

A more complete understanding of the present invention can be attained by considering the following detailed description in conjunction with the accompanying drawing.

BRIEF DESCRIPTION OF THE DRAWING

The FIGURE is a highly enlarged cross-sectional view of a portion of a wafer surface including a partial semiconductor structure being disposed thereon.

DETAILED DESCRIPTION OF THE INVENTION

The FIGURE illustrates a highly enlarged crosssectional view of a portion of a wafer surface 10 including a partial semiconductor structure being disposed thereon. Included is substrate 12 which comprises single crystal silicon in this embodiment. A first dielectric layer 14 is disposed on substrate 12. First dielectric layer 14 is comprised of a suitable dielectric such as silicon dioxide ($SiO_2$) or the like. A patterned first metal layer 16 comprised of an aluminum alloy (1.5% silicon), in this embodiment, is disposed on first dielectric layer 14. One skilled in the art will understand that although a specific metal scheme is described in conjunction with this embodiment, many other well known metal schemes may be employed.

A metal cap 18 is disposed upon first metal layer 16. Metal cap 18 is comprised of a titanium/tungsten (TiW) alloy in this embodiment. However, it should be understood by one skilled in the art that the present invention may be employed without the use of metal cap 18. A second dielectric layer 20 also comprised of a suitable dielectric such as silicon dioxide is disposed on first dielectric layer 14 and metal cap 18. A recess 22 has been etched through second dielectric layer 20 and extends to metal cap 18. Although specific materials have been disclosed in accordance with the FIGURE, one skilled in the art will understand that the present invention may be employed with semiconductor structures comprising other material schemes.

It is often necessary in the manufacture of semiconductor devices to deposit metal in recesses and openings such as recess 22. Common applications for this are via fill in multilayer interconnect systems, contact fill to single or polycrystalline silicon, fabrication of Schottky barrier diodes and the like. These applications make it desirable to selectively deposit metals on conducting materials such as metal cap 18 while not depositing on the non-conducting material such as second dielectric layer 20. However, difficulties are encountered in the selective deposition of metals when conducting materials oxidize or non-conducting materials have impurities or contamination thereon. When conducting materials oxidize, metal will not readily deposit thereon. Conversely, impurities on the non-conducting materials cause undesirable metal deposition thereon.

The selective deposition of metals may be greatly enhanced by subjecting wafer surface 10 to a hydrogen species. Hydrogen has a low diffusion rate into many conducting materials such as metals while it merely passes through many non-conducting materials such as dielectrics. In other words, metal cap 18 will become saturated with hydrogen while second dielectric layer 20 will not. The hydrogen species actually cleans wafer surface 10 in two ways. First, the physical interaction between the hydrogen and wafer surface 10 will remove native oxides from metal cap 18 while also removing impurities from second dielectric layer 20. Second, the chemical interaction between the hydrogen and wafer surface 10 will allow for reduction of the native oxides and further cleansing of impurities.

It should be understood that hydrogen may come from one or more of a number of distinct sources. For instance, the hydrogen may be supplied as H2 gas or may be derived from a silane on other hydrogen containing compound gas. Additionally, many methods of providing the hydrogen species such as hydrogen plasma treatments, annealing wafer surface 10 in a hydrogen atmosphere or hydrogen ion implantation may be employed. However, it is important to understand that in subjecting wafer surface 10 to a hydrogen species, the temperature must be kept low enough so that the semiconductor structure is not destroyed, the diffusion distribution is not altered and the junction distribution remains as desired.

Depending upon the type of reactor employed and its configuration, wafer surface 10 may be subjected to a hydrogen species and have metal selectively deposited thereon simultaneously or by using separate processing steps. If tungsten (W) were to be deposited on metal cap 18 of wafer surface 10, a typical reaction would be:

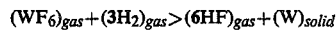

This reaction represents the reduction of tungsten hexafluoride ($WF_6$) by hydrogen gas. Although the tungsten source of the above reaction was tungsten hexafluoride, other gases containing tungsten such as tungsten hexachloride ($WCl_6$) may be employed in its place. One skilled in the art will further understand that other metal containing gases and compounds capable of being reduced by hydrogen may be employed in conjunction with the present invention.

A specific example of the present invention being employed using two processing steps in different reactors is as follows. Initially, wafer surface 10 is placed into an RIE reactor. In this embodiment the RIE reactor is an Applied Materials AME 8120. The RIE reactor is set so that the wafer temperature is in the range of 45 to 50 degrees centigrade with a preferred wafer temperature being approximately 48 degrees centigrade. The reactor pressure is set in a range of 80 to 120 millitorr with a preferred pressure of approximately 90 millitorr. The hydrogen flow is in the range of 10 to 80 SCCM with a preferred flow being approximately 50 SCCM. The RF power supplied is in the range of 1000 to 1500 watts with a preferred power of approximately 1225 watts while the reaction time is in the range of 1 to 10 minutes with a preferred time of approximately 5 minutes.

Once wafer surface 10 has been subjected to the hydrogen plasma treatment in the RIE reactor as discussed above, it is placed into a Spectrum CVD single wafer LPCVD system under the following conditions. The wafer temperature is set in a range of 450 to 500 degrees centigrade with a preferred temperature again being approximately 480 degrees centigrade. The reactor pressure is in the range of 100 to 150 millitorr with a preferred pressure of approximately 120 millitorr while the hydrogen gas flow is in a range of 20 to 60 SCCM with a preferred gas flow of approximately 40 SCCM. The tungsten hexafluoride flow is in the range of 2 to 6 SCCM with a preferred flow of approximately 4 SCCM. The above conditions will result in a tungsten deposition rate upon metal cap 18 in recess 22 of approximately 1000 angstroms per minute with a deposition rate of substantially zero on second dielectric layer 20. Again, one skilled in the art will understand that these parameters may vary depending upon the reactors and materials employed as well as the deposition rate desired.

Thus it is apparent that there has been provided, in accordance with the invention, an improved method for the selective deposition of metal in semiconductor device manufacturing. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A method for the selective deposition of tungsten in semiconductor device manufacturing comprising the steps of:
   providing a wafer surface including semiconductor structures disposed thereon, said wafer surface having both conducting and non-conducting materials;
   placing said wafer surface into an RIE reactor and subjecting it to a hydrogen plasma; and
   placing said wafer surface into a CVD reactor and selectively depositing tungsten on said conducting materials of said wafer surface, said tungsten being derived from tungsten hexafluoride that is reduced by hydrogen on said wafer surface, the wafer temperature being in the range of 450 to 500 degrees centigrade, the reactor pressure being in the range of 100 to 150 millitorr, the hydrogen gas flow being in the range of 20 to 60 SCCM and the tungsten hexafluoride gas flow being in the range of 2 to 6 SCCM.

2. The method of claim 1 wherein the placing said wafer surface into a CVD reactor step includes selectively depositing tungsten on the wafer surface wherein the wafer temperature is approximately 480 degrees centigrade, the reactor pressure is approximately 120 millitorr, the hydrogen gas flow is approximately 40 SCCM and the tungsten hexafluoride gas flow is approximately 4 SCCM.

3. The method of claim 1 wherein the placing said wafer surface into an RIE reactor step includes the wafer temperature being in a range of 45 to 50 degrees centigrade, the reactor pressure being in a range of 80 to 120 millitorr, a hydrogen gas flow being in a range of 10 to 80 SCCM, the RF power being in a range of 1000 to 1500 watts and the reaction time being in the range of 1 to 10 minutes.

4. The method of claim 3 wherein the placing said wafer surface into an RIE reactor step includes the wafer temperature being approximately 48 degrees centigrade, the reactor pressure being approximately 90 millitorr, the hydrogen gas flow being approximately 50 SCCM, the RF power being approximately 1225 watts and the reaction time being approximately 5 minutes.

5. A method for the selective deposition of metals in semiconductor device manufacturing comprising the steps of:
   providing a wafer surface including semiconductor structures disposed thereon, said wafer surface having both conducting and non-conducting materials;
   placing said wafer surface into an RIE reactor and subjecting it to a hydrogen plasma, the wafer temperature being in the range of 45 to 50 degrees centigrade, the reactor pressure being in the range of 80 to 120 millitorr, the hydrogen gas flow being in the range of 10 to 80 SCCM, the RF power being in the range of 1000 to 1500 watts and the reaction time being in the range of 1 to 10 minutes; and placing said wafer surface into a CVD reactor and selectively depositing metal on said conducting materials of said wafer surface.

6. The method of claim 5 wherein the placing said wafer surface into an RIE reactor step includes the wafer temperature being approximately 48 degrees centigrade, the reactor pressure being approximately 90 millitorr, the hydrogen gas flow being approximately 50 SCCM, the RF power being approximately 1225 watts and the reaction time being approximately 5 minutes.

7. The method of claim 5 wherein the placing said wafer surface into a CVD reactor step includes selectively depositing a metal derived from a metal containing compound that is reduced by hydrogen, on the wafer surface.

8. The method of claim 7 wherein the placing said wafer surface into a CVD reactor step includes selectively depositing tungsten of the wafer surface wherein the wafer temperature is in the range of 450 to 500 degrees centigrade, the reactor pressure is in the range of 100 to 150 millitorr, a hydrogen gas flow is in the range of 20 to 60 SCCM and a tungsten hexafluoride gas flow is in the range of 2 to 6 SCCM.

9. The method of claim 8 wherein the placing said wafer surface into a CVD reactor step includes selectively depositing tungsten on the wafer surface wherein the wafer temperature is approximately 480 degrees centigrade, the reactor pressure is approximately 120 millitorr, the hydrogen gas flow is approximately 40 SCCM and the tungsten hexafluoride gas flow is approximately 4 SCCM.

* * * * *